US007033461B2

(12) United States Patent
Tani et al.

(10) Patent No.: US 7,033,461 B2
(45) Date of Patent: Apr. 25, 2006

(54) THIN FILM FORMING APPARATUS AND METHOD

(75) Inventors: Noriaki Tani, Chiba (JP); Toshihiro Suzuki, Chiba (JP); Satoshi Ikeda, Chiba (JP); Hiroaki Kawamura, Chiba (JP); Satoru Ishibashi, Chiba (JP); Kouichi Hanzawa, Kanagawa (JP); Takafumi Matsumoto, Kanagawa (JP)

(73) Assignee: ULVAC, Inc., Kanagawa (JP)

( * ) Notice: Subject to any disclaimer, the term of this patent is extended or adjusted under 35 U.S.C. 154(b) by 0 days.

(21) Appl. No.: 10/284,287

(22) Filed: Oct. 31, 2002

(65) Prior Publication Data

US 2003/0085115 A1 May 8, 2003

(30) Foreign Application Priority Data

Nov. 2, 2001 (JP) ............................ 2001-337987
Dec. 3, 2001 (JP) ............................ 2001-368425

(51) Int. Cl.
*C23C 14/35* (2006.01)
*C23C 16/00* (2006.01)

(52) U.S. Cl. .......................... 204/192.13; 204/192.12; 204/298.03; 204/298.11; 427/282; 118/720; 118/504

(58) Field of Classification Search ........... 204/192.12, 204/298.11, 298.03, 192.13; 427/282; 118/720, 118/504
See application file for complete search history.

(56) References Cited

U.S. PATENT DOCUMENTS 3,664,295 A * 5/1972 Ng et al. .................... 118/712
4,311,725 A * 1/1982 Holland ....................... 427/10
4,767,517 A 8/1988 Hiraki et al. .......... 204/192.15
6,547,939 B1 * 4/2003 Hsueh et al. .......... 204/298.03

OTHER PUBLICATIONS

Taiwanese Office Action dated Aug. 27, 2004.

* cited by examiner

*Primary Examiner*—Rodney G. McDonald
(74) *Attorney, Agent, or Firm*—Arent Fox PLLC

(57) ABSTRACT

The present invention provides an efficient thin film forming apparatus which is capable of correcting a film thickness so as to take care of a variation in distribution in the film thickness and to take care of the circumferential distribution of the film thickness, as well as a method for forming a thin film using this film forming apparatus. The method comprises the first step of first forming a thin film to a predetermined percentage out of thickness through an opening 8*a* in a shutter 8, the second step of then using a film thickness monitor 10 to measure the distribution of the thickness of the thin film formed in the first step, and the third step of reducing a film formation rate by an opening 8*b* in the shutter 8 between a substrate 4 and a sputtering cathode 6 as compared to that of the first step and correcting the thickness of the thin film by an opening 13*a* in the first film thickness correcting plate 13 between the substrate 4 and the sputtering cathode 6 corresponding to the distribution of the film thickness measured by the film thickness monitor 10 in the second step. Then, the second step is carried out again, during which the film thickness monitor 10 is used to measure the distribution of the thickness of the thin film formed in the third step. Further, the third and second steps are repeatedly carried out.

18 Claims, 5 Drawing Sheets

THIN FILM FORMING APPARATUS AND METHOD

BACKGROUND OF THE INVENTION

1. Field of the Invention

The present invention relates to an apparatus which forms a thin film on a substrate and a method for forming a thin film using the apparatus. For example, when a film is formed on a glass substrate using a sputtering apparatus and the like, on the occasion that sputtering grains deposit at desired positions on the substrate to form a thin film, such a thin film tends to be formed, so that the distribution of film thickness gives a peak in a portion of the substrate corresponding to a target center in the radial direction of the rotatable substrate in spite of rotation of the substrate intended to allow film formation conditions to be uniform. Furthermore, in the circumferential direction of the rotatable substrate, depending on the places where film formation is started and ended on the rotated substrate, such a distribution of film thickness tends to be obtained that these places constitute the start and end points of the distribution. The dispersion of such a film thickness tends to be several percent out of a desired film thickness value. However, in the field of optical thin films for use in optical devices, optical filters and the like, it is desirable to form a thin film having a strictly precise and uniform thickness in order to control optical film thickness (film thickness×refractive index), which varies depending on the film thickness.

2. Description of the Related Art

A conventional sputtering apparatus, which rotates a substrate in order to unify film formation conditions and which forms a thin film on this substrate, is constructed as shown in FIG. 1. In this apparatus, a substrate holder 3 rotatably supported by a rotating shaft 2 is provided in the upper portion of an apparatus chamber 1. A glass substrate 4 is mounted on the holder 3. Furthermore, the apparatus chamber 1 has a sputtering cathode 6 having a Ti target 5 facing the substrate 4 arranged at the lower portion of a cross section in one side region thereof, as a film forming source. A protective cover 7 is installed outside a sputtering target composed of the Ti target 5 and the sputtering cathode 6. Furthermore, a shutter 8 having a circular opening 8*a* is provided in the lower portion of the apparatus chamber 1 and the shutter 8 is supported by a rotating shaft 9 so as to be rotatable around it (see FIG. 2).

In the sputtering apparatus in FIG. 1, the rotating shaft 2 of the substrate holder 3 and the rotating shaft 9 of the shutter 8 can be rotated at each rotation rate independently. Furthermore, the substrate holder 3 and the substrate 4 have a film thickness monitor 10 provided thereon to measure the thickness of a thin film formed on the substrate 4. The film thickness monitor 10 is composed of light emitting sections $\mathbf{10}a_1$ to $\mathbf{10}a_3$ and light receiving sections $\mathbf{10}b_1$ to $\mathbf{10}b_3$ corresponding to the light emitting sections $\mathbf{10}a_1$ to $\mathbf{10}a_3$, each by each. Combinations of the light emitting sections 10*a* and the light receiving sections 10*b* comprise the first monitor $\mathbf{10}a_1$–10*b*1, the second monitor $\mathbf{10}a_2$–$\mathbf{10}b_2$ and the third monitor $\mathbf{10}a_3$–$\mathbf{10}b_3$. Thus, the optical sensors composed of the light emitting sections $\mathbf{10}a_1$ to $\mathbf{10}a_3$ and the light receiving sections $\mathbf{10}b_1$ to $\mathbf{10}b_3$ constitute a series of monitors (the first to the third monitors), thereby enabling the film thickness monitor 10 to measure the transmittance between the glass substrate 4 and the thin film to monitor the uniformity of the thickness of the thin film. Furthermore, the apparatus chamber 1 can be evacuated by a vacuum pump 11. Furthermore, a gas introducing port 12*a* is provided in a sputtering target-side region at the lower portion of the cross section of the apparatus chamber 1 so as to introduce sputtering gas therethrough. A gas introducing port 12*b* is located close to the substrate holder 3 in the upper portion of the cross section of the apparatus chamber 1 so as to introduce reactive gas therethrough.

To form a film on the glass substrate 4, the inside of the chamber 1 is first evacuated as a pre-treatment by the vacuum pump 11. Then, Ar gas is introduced through the gas introducing port 12*a* as sputtering gas. The shutter 8 is then rotated around the rotating shaft 9 to adjust the opening 8*a* to the position except for over the target 5. Then, by a presputtering to apply electric power to the sputtering cathode 6, the surface of the target 5 becomes cleaned-up. Subsequently, Ar gas is introduced through the gas introducing port 12*a* as sputtering gas, while oxygen gas is introduced through the gas introducing port 12*b* as reactive gas. Furthermore, the shutter 8 is rotated around the rotating shaft 9 to adjust the opening 8*a* to the position over the target 5. Electric power is applied to the sputtering cathode 6 to sputter the Ti target 5 on the sputtering cathode 6. Thus, an oxide film, $TiO_2$, is formed on the substrate 4. At that time, the substrate holder 3 and thus the substrate 4 are rotating around the rotating shaft 2. Then, $TiO_2$ on the substrate 4 is formed continuously for a predetermined time, while the film thickness monitor 10 is used to measure the thickness of a thin film formed on the substrate 4. Once the thin film has been formed to reach to a predetermined thickness, the shutter 8 is rotated again to adjust the opening 8*a* to the position except for over the target 5. Then the film formation is finished.

In this conventional apparatus, the shutter 8 is used as means for switching the start and the end of film formation or as means for preventing a target substance from flying to the substrate 4 during the presputtering step. And the shutter 8 also has a function of correcting the distribution of the thickness of a thin film on the substrate 4 by means of the shape of the opening 8*a* thereof. Japanese Patent Laid-Open No. H4-173972 discloses, in its FIG. 5, a sputtering apparatus comprising a shutter (film thickness correcting plate) having an opening shaped to enable the film thickness to be corrected in the above-mentioned manner in which the shutter (film thickness correcting plate) has the opening 8*a*.

However, with a shutter (film thickness correcting plate) having an opening with a fixed shape, it is difficult to take care of changes in various sputtering conditions during sputtering step (the vacuum degree, the amount of gas introduced, the amount of gas released from the chamber, the sputtering voltage, the sputtering current and the like). In particular, it is known in the field of optical thin films, that thin films, such as oxide or nitride films tend to be formed using a reactive sputtering apparatus and that film formation rate and film quality of this case depend on the state of the surface of the target. And the state of the surface of the target is related to the partial pressure of the reactive gas. Generally, the film formation rate and the partial pressure of the reactive gas have such a correlation as shown with a hysteresis curve. Furthermore, the hysteresis curve changes markedly at the time of input electric power, resulting in an unstable state. Consequently, the above-mentioned sputtering conditions tend to be varied.

Thus, Japanese Patent Laid-Open No. S61-183464 discloses, in its FIG. 2, an apparatus in which a large number of film thickness correcting plates movable constitute a film thickness correcting member to adjust the shape of the opening, thereby taking care of a change in distribution of the film thickness. However, this apparatus may fail in maintaining a vacuum degree in the chamber when a driving work for the film thickness correcting plates is carried out. Consequently, this apparatus cannot be efficient from the handling point of view.

Furthermore, the above-mentioned conventional arts disclosed in Japanese Patent Laid-Open Nos. H4-173972 and S61-183464 correct the distribution of the thickness of a thin film formed on the rotatable substrate in the radial direction thereof. Their effects are not sure in correcting the distribution of the film thickness in a circumferential direction, given at the start or end of rotation.

In view of the above-mentioned problems, it is an object of the present invention to provide a thin film forming apparatus which is capable of efficiently correcting the film thickness so as to take care of changes in radial distribution of the film thickness caused in various sputtering conditions and to take care of the circumferential distribution of the film thickness, as well as a method for forming a thin film using this film forming apparatus.

SUMMARY OF THE INVENTION

To attain the above-mentioned object, the first embodiment of the present invention provides a thin film forming apparatus comprising a substrate and a film forming source which are mutually located opposite, the apparatus further comprising a film formation rate controlling member having an opening used to control a film formation rate of a thin film formed on the substrate, and a film thickness correcting member having an opening used to correct the thickness of the thin film formed on the substrate, the film formation rate controlling member and the film thickness correcting member being provided so as to be inserted between the substrate and the film forming source and to be removed therefrom.

In this case, in the apparatus, when the film formation rate controlling member and the film thickness correcting member are inserted between the substrate and the film forming source, these components are disposed in the order of the substrate, the film thickness correcting member, the film formation rate controlling member and the film forming source.

The film formation rate controlling member has two or more openings which are different each in area and each of the openings can be selected in the order of the scale of the area of the opening. Then, each opening is to be selected to efficiently control the film formation rate.

Furthermore, the film formation rate controlling member is two or more film formation rate controlling plates each having an opening, the openings in the film formation rate controlling plates being different each in area, and each of the film formation rate controlling plate can be selected. Also in this case, each film formation rate controlling plate is to be selected to efficiently control the film formation rate.

On the other hand, the film thickness correcting member has two or more openings each having a different shape and each of the openings can be selected depending on the distribution of the thickness of the thin film on the substrate. Then, each opening is to be selected to efficiently correct the film thickness.

Furthermore, the opening in the film thickness correcting member has two or more selectable shutters movable and the area of the opening can be increased or reduced by selectively moving the shutter depending on the distribution of the thickness of the thin film on the substrate. Then, each movable shutter is to be selected to increase or reduce the area of the opening to efficiently correct the film thickness.

In these cases, in particular, an external electric signal is used to move the shutters. Then, the movement of the shutters can be controlled outside the chamber, thereby eliminating disadvantages from the handling point of view, such as break of a vacuum state inside the chamber.

A method for forming a thin film using the above-mentioned first film forming apparatus comprises the first step of first forming the thin film to a predetermined percentage out of thickness, the second step of then measuring the distribution of the thickness of the thin film formed in the first step, and the third step of further inserting the film formation rate controlling plate between the substrate and the film forming source to make a film formation rate less than that of the first step, and inserting the film thickness correcting plate between the substrate and the film forming source corresponding to the distribution of the film thickness measured in the second step to correct the thickness of the thin film. These steps are sequentially carried out. Then, after a thin film has been formed to a dominant percentage out of the desired thickness (about 95% or more) during the first step, while the distribution of the film thickness can be monitored during the second step, the film thickness correcting plate can be used to correct the film thickness during the third step. Consequently, the desired uniform film thickness is obtained.

In this case, the second step is carried out again to measure the distribution of the thickness of the thin film formed in the third step, and the current third step and the current second step are subsequently repeatedly carried out as the same cycle, the current third step simultaneously performing an operation of inserting, between the substrate and the film forming source, the film formation rate controlling plate having an opening, which enables the film formation rate to be controlled, in order to thus make the film formation rate less than that of the preceding third step, and performing an operation of inserting, between the substrate and the film forming source, the film thickness correcting plate having an opening which enables the thickness of the thin film to be corrected corresponding to the distribution of the film thickness measured in the preceding second step carried out again after the preceding third step, in order to thus correct the thickness of the thin film, the current second step measuring the distribution of the thickness of the thin film formed in the current third step. The current third step and the current second step are subsequently repeatedly carried out as the same cycle. Then, the thin film with the desired film thickness is finally obtained. The formation of the thin film with the desired film thickness is confirmed by measurements in the current second step.

Furthermore, during the same cycle, the second step is carried out simultaneously together with the first step and the third step. Then, measurements with the film thickness monitor are fed back more quickly. This enables the distribution of the film thickness to be more efficiently corrected.

According to the second embodiment of the film forming apparatus of the present invention, in the above-mentioned apparatus, in particular, a rotatable substrate is used as the substrate, and film thickness measuring means are provided to measure the thickness of the thin film at plural measured points along the radius of the rotatable substrate, the film formation rate controlling member is provided with an opening which serves to a film formation rate gradient inclined along the radius of the rotatable substrate and an opening and closing shutter which enables the opening extent of the opening to be increased or reduced, and a movable shutter is used as the film thickness correcting member to shut off formation of a thin film on the substrate.

This apparatus can move the opening and closing shutter provided with the film formation rate controlling member, corresponding to the value measured by the film thickness measuring means, to increase or reduce the opening extent of the opening in the film formation rate controlling member. This enables to control the rate at which a thin film is formed on the substrate. Furthermore, this apparatus can move the shutter, namely the film thickness correcting member, corresponding to the value measured by the film thickness measuring means, to shut off film formation in a certain region of the substrate. Consequently, with the film formation rate controlling member and its opening and closing shutter, the distribution of film thickness in the radial direction, which is precisely inclined along the radius of the rotatable substrate, can be finally corrected so as to become flat, with the desired film thickness sequentially, by using the movable shutter to accordingly shut off film formation in film formation regions in which the desired film thickness has been achieved. At that time, the opening and closing shutter is moved to reduce the opening extent of the opening in the film formation rate controlling member, thereby reducing the rate at which the thin film is formed. This allows the circumferential distribution of the thickness of the thin film on the substrate to be also corrected so as to become flat.

Furthermore, at that time, by measuring the thickness of the thin film at plural points along the radius of the rotatable substrate, the radial and circumferential distributions of the thickness of the thin film cannot only be measured more sensitively but the distribution of the film thickness inclined in the radial direction of the rotatable substrate can also be precisely observed.

A method for forming a thin film using the thin film forming apparatus according to the above-mentioned second embodiment comprises the first step of first inserting, among the film formation rate controlling member and the film thickness correcting member, only the film formation rate controlling member between the substrate and the film forming source and forming the thin film to a predetermined percentage out of thickness, while the opening and closing shutter of the film formation rate controlling member remains open, the second step of then moving the opening and closing shutter of the film formation rate controlling member corresponding to a value measured by the film thickness measuring means during the first step while only the film formation rate controlling member remains inserted between the substrate and the film forming source during the first step, thereby reducing the opening extent of the opening as compared to that of the first step, and the third step of subsequently moving the shutter between the substrate and the film forming source corresponding to the value measured by the film thickness measuring means during the second step while the opening extent of the opening in the film formation rate controlling member reduced during the second step remains reduced, thereby shutting off film formation in a film formation region on the substrate in which the desired film thickness has been achieved. These steps are carried out in this order.

With this method, during the first step, a thin film is formed to a dominant percentage (about 95% in the maximum film thickness portion) out of the desired thickness. Then during the second step, the desired thickness is achieved precisely at a relatively lower film formation rate, while the circumferential distribution of the film thickness is corrected so as to become flat. Furthermore, during the third step, the film thickness correcting member shuts off film formation in film formation regions on the substrate in which the desired film thickness has been achieved. Consequently, the radial distribution of the film thickness can be corrected so as to become flat at last, enabling to obtain the desired uniform film thickness.

In the above-described film forming apparatuses according to the first and second embodiments, when the film forming source is provided as a sputtering cathode, both can be handled as ordinary sputtering apparatuses.

In this case, a dielectric thin film can be formed by a reaction of a target material with reactive gas by reactive sputtering process which uses the sputtering cathode, sputtering gas comprising of rare gas, and reactive gas.

Such reactive gas may be gas containing elements, such as oxygen, nitrogen, carbon, silicon and the like. However, not only such mono-substance gas ($O_2$, $O_3$, $N_2$ and the like) or compound gas ($N_2O$, $H_2O$, $NH_3$ and the like) but also a mixture thereof may be used.

In this case, the film forming apparatus further comprises metal film forming means using the sputtering gas comprising rare gas to sputter target metal of the sputtering cathode to form a metal thin film on the substrate and oxidizing or nitriding means for oxidizing or nitriding the metal thin film formed on the substrate using the reactive gas. This apparatus is allowed to divide sputtering region and reaction region, thereby enabling a dielectric thin film to be more efficiently formed.

DETAILED DESCRIPTION OF THE PREFERRED EMBODIMENTS

Figure 3:
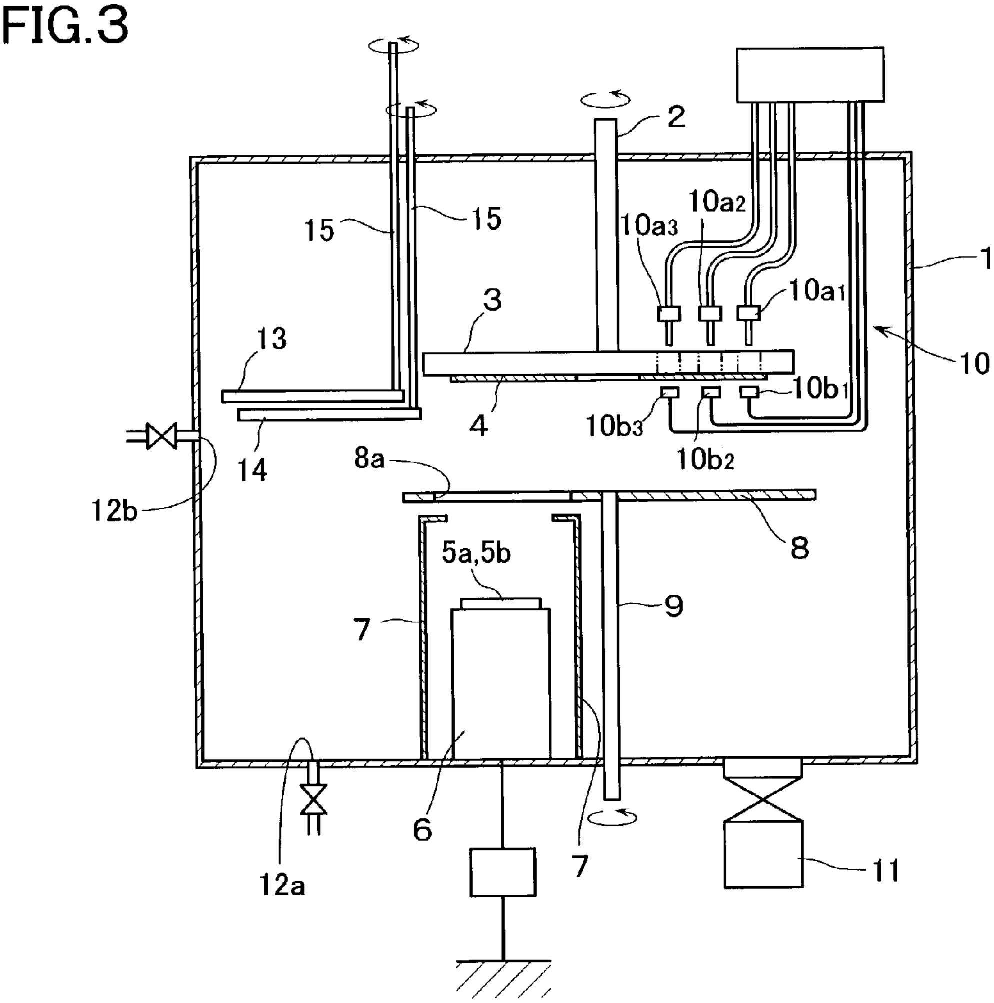
FIG. 3 is a schematic sectional view of a reactive sputtering apparatus according to the first embodiment of the present invention.
Figure 4:
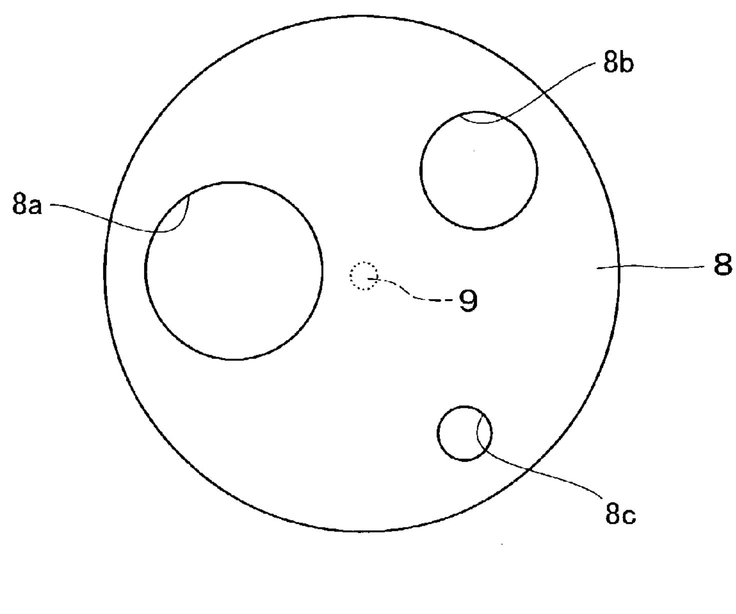
FIG. 4 is a top view of a shutter (film formation rate controlling plate) in FIG. 3.
Figure 5:
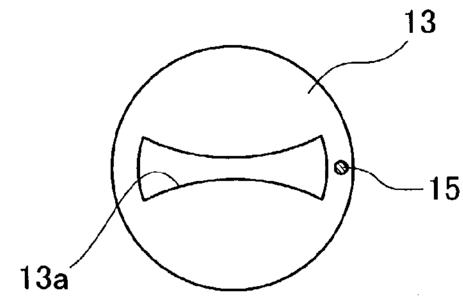
FIG. 5 is a top view of the first film thickness correcting plate in FIG. 3.
Figure 6:
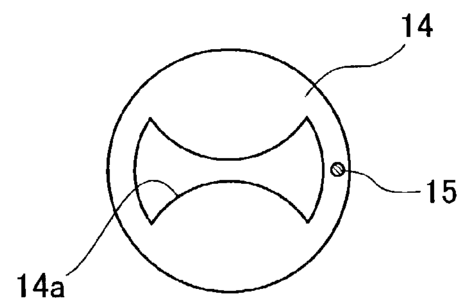
FIG. 6 is a top view of the second film thickness correcting plate in FIG. 3.

FIG. 3 schematically shows a reactive sputtering apparatus according to the first embodiment of the present invention. This apparatus differs from the reactive sputtering apparatus in FIG. 1 in that a film thickness correcting member composed of two film thickness correcting plates, namely the first and the second film thickness correcting plates 13, 14, are provided close to the substrate holder 3. The first and second film thickness correcting plates 13 and 14 are both supported by a rotating shaft 15 and are rotatable around this shaft independently. Furthermore, FIG. 4 is a top view of the shutter 8 in FIG. 3. The shutter 8 used in the film forming apparatus in FIG. 3 has openings 8*a*, 8*b*, and 8*c* which are provided therein and different each in area. The shutter 8 is rotated around the rotating shaft 9 to allow each of the openings 8*a*, 8*b*, and 8*c* to be selected in the order of the scale of the area of the opening. Furthermore, FIG. 5 is a top view of the first film thickness correcting plate 13. FIG. 6 is a top view of the second film thickness correcting plate 14. The first film thickness correcting plate 13 in FIG. 5 has an opening 13*a* provided therein. The second film thickness correcting plate 14 in FIG. 6 has an opening 14*a* provided therein. The shapes of the openings 13*a* and 14*a* are different.

Figure 1:
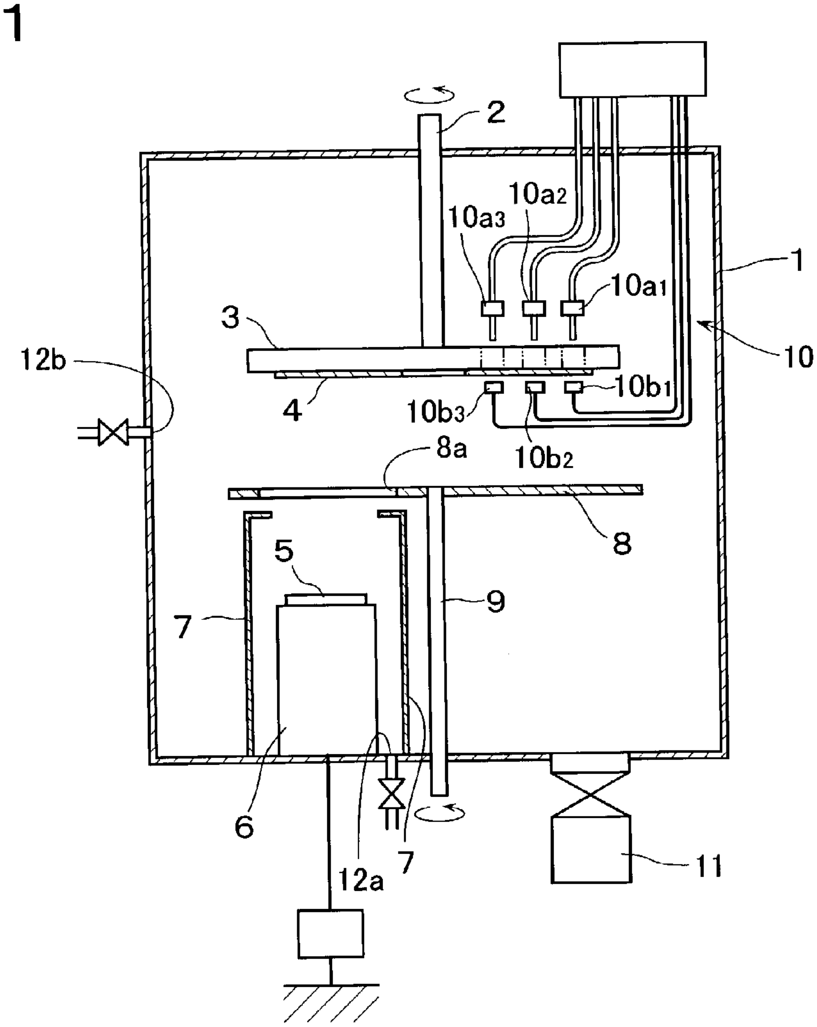
FIG. 1 is a schematic sectional view of a conventional reactive sputtering apparatus.
Figure 2:
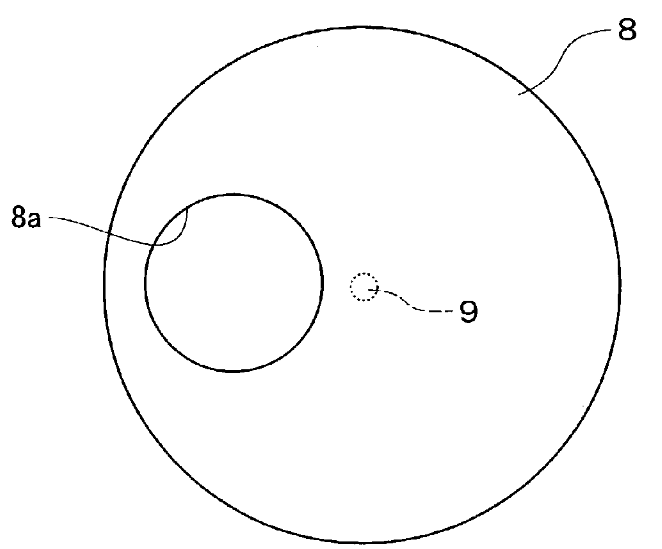
FIG. 2 is a top view of a shutter (film formation rate controlling plate) in FIG. 1.

To form a film on the glass substrate 4 using the film forming apparatus in FIG. 3, a pre-treatment and a presputtering step like the case of FIG. 1 are first carried out. Then, Ar gas is introduced through the gas introducing port 12*a* as sputtering gas, and oxygen gas is introduced through the gas introducing port 12*b* as reactive gas. Furthermore, the shutter 8 is rotated around the rotating shaft 9 so as to locate the opening 8*a* over the target 5. Then, electric power is applied to the sputtering cathode 6 and thus to the Ti target 5 on the sputtering cathode 6. Thus, an oxide film consisting of $TiO_2$ is formed on the substrate 4. At that time, the substrate holder 3 and thus the substrate 4 are rotating around the rotating shaft 2. Then, $TiO_2$ on the substrate 4 is formed continuously for a predetermined time. Once the thin film has been formed to about 95% out of the desired thickness, the shutter 8 is rotated again so that none of the openings 8*a*, 8*b*, and 8*c* are located over the target 5. Then, the film formation is finished.

In this embodiment, the oxide film consisting of $TiO_2$ is formed as a dielectric thin film. However, a nitride film may be formed by introducing nitrogen gas through the gas introducing port 12*b* as reactive gas.

Then, the film thickness monitor 10 is used to measure the thickness of the thin film formed on the substrate 4. The film thickness monitor 10 measures the thickness of the thin film on the substrate 4 at three points. Obtaining these three-point data at every predetermined time enables monitoring of the distribution of the thickness of the thin film in the radial direction of the rotation circle of the substrate holder 3.

Furthermore, one of the first and second film thickness correcting plates 13 and 14 is selected which is suitable for correcting the distribution of the film thickness indicated by the results of the measurements, and is inserted between the substrate 4 and the target 5 by rotating it around the rotating shaft 15. Simultaneously, the shutter 8 is rotated to locate the opening 8*b* over the target 5. Then, the formation of the thin film is restarted so as to achieve the remaining portion (about 5% or less) out of the desired thickness.

In this case, the opening 8*a* in the shutter 8 is changed to the opening 8*b* in order to reduce its opening area and thus the film formation rate as compared to that of the preceding film formation step. With respect to realization of strictly precise uniformity desired for the thickness of the thin film, formation of circumferential distribution of the film thickness depends significantly on whether or not a film is being formed when the shutter is opened to start or closed to end film formation, while this dependency can be lowered by reducing the film formation rate as described above. In this sense, the shutter 8 having the openings 8*a*, 8*b*, and 8*c* has function of film formation rate controlling members by enabling its opening area to be changed by selecting each of the openings 8*a*, 8*b*, and 8*c*, the area of which is different each other. Furthermore, this reduction in film formation rate does not affect sputtering conditions per se, because the state of surface of the target 5, the partial pressure of the reactive gas and the like are not fluctuated unlike the case of a reduction in the film formation rate effected by reducing electric power applied to the sputtering cathode 6.

In this embodiment, the single shutter having plural openings is used. However, two or more shutters each having one opening, each opening in a shutter having a different area, may be used so that any of the shutters can be used to control the film formation rate by appropriately selecting each of shutters.

Then, $TiO_2$ on the substrate 4 is formed continuously for a predetermined time. Once most of (about 95% out of the remaining 5%) the thin film has been formed, the shutter 8 is rotated again so that none of the openings 8*a*, 8*b*, and 8*c* are located over the target 5. The film formation is finished.

Furthermore, the film thickness monitor 10 measures the thickness of the thin film formed on the substrate 4. Then, one of the first and second film thickness correcting plates 13 and 14 is selected which is suitable for correcting the distribution of the film thickness indicated by the results of the measurements. The selected film thickness correcting plate is inserted between the substrate 4 and the target 5 by rotating it around the rotating shaft 15. Simultaneously, the shutter 8 is rotated to locate the opening 8*c* over the target 5. Then, the formation of the thin film is restarted so as to achieve the remaining portion out of the desired thickness.

Such a process is repeated, and all the film formation process is finished when the value measured by the thin film monitor 10 indicates a desired value for the film thickness.

Figure 7:
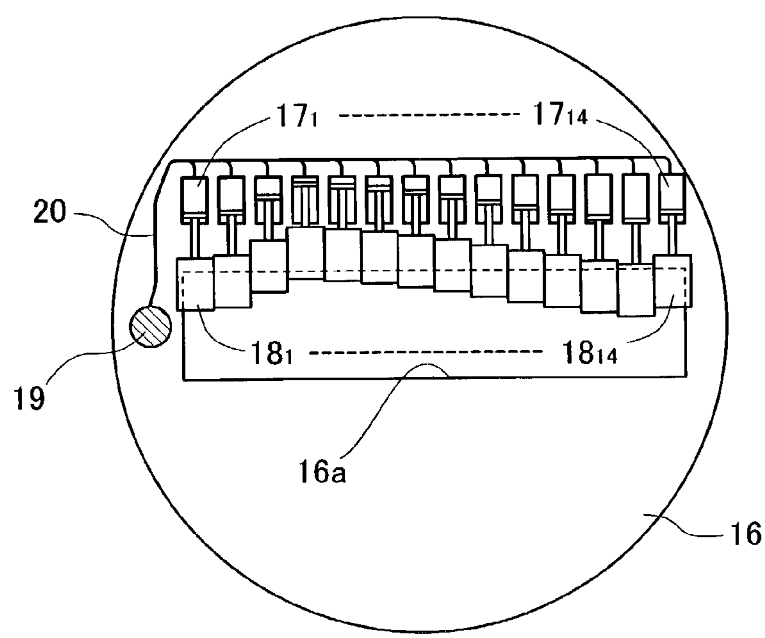
FIG. 7 is a top view of the third film thickness correcting plate used in Example 3 of the present invention.

In this embodiment, the film thickness correcting member is designed with the first and second film thickness correcting plates 13 and 14, which have a fixed opening shape. However, a single film thickness correcting plate with two or more openings each having a different shape may be used instead. Furthermore, as shown in FIG. 7, the third film thickness correcting plate 16 may be used which can change the opening shape 16*a* of the opening as shown in FIG. 7. (for the details of the third film thickness correcting plate 16, see Example 3, described later). When the first to third film thickness correcting plates 13, 14 and 16 are constructed to be movable with external electric signals, then these film thickness correcting plates can be controlled outside the chamber. This eliminates disadvantages from the handling point of view, such as break of a vacuum state inside the chamber.

Figure 8:
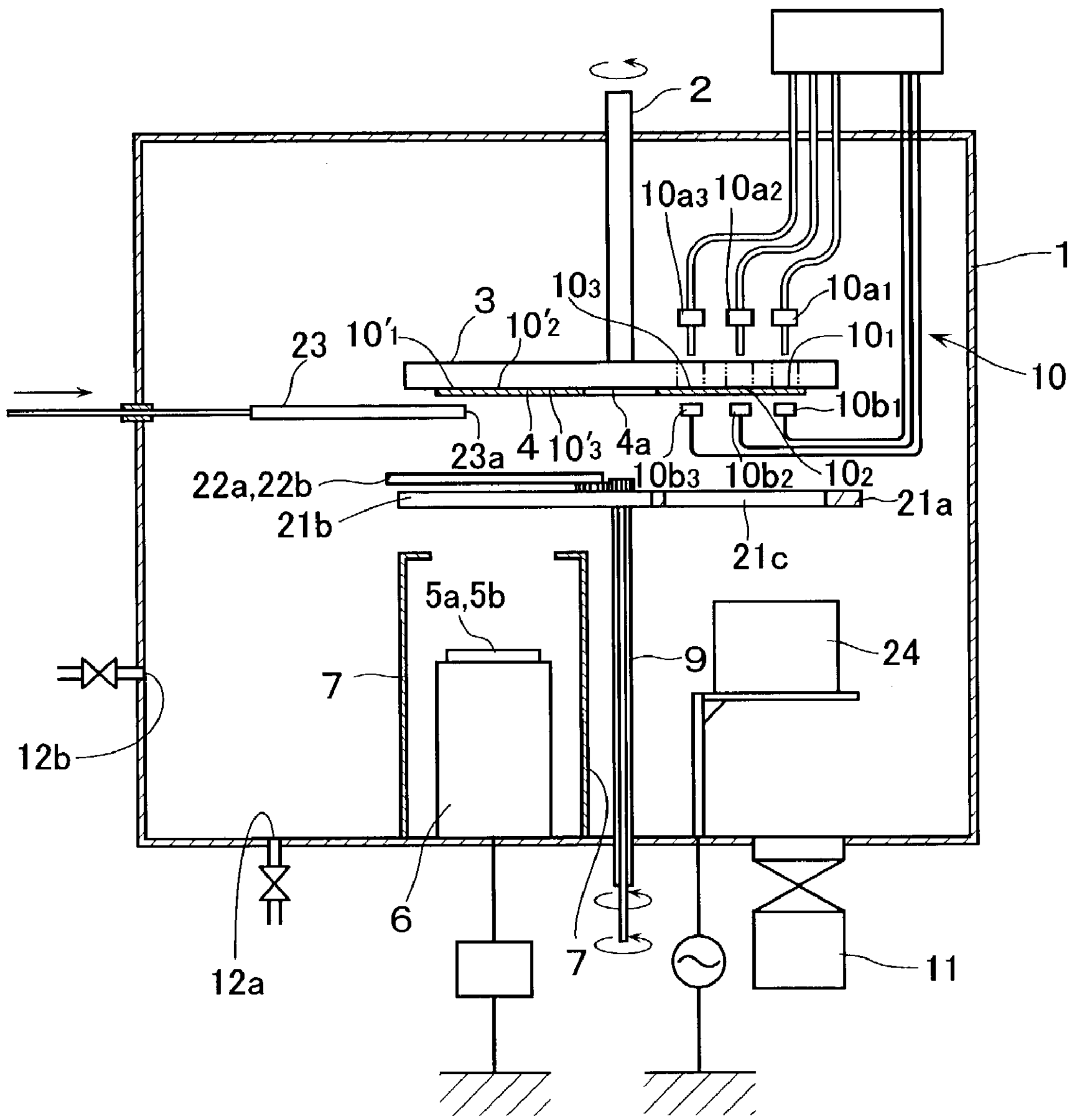
FIG. 8 is a schematic sectional view of a reactive sputtering apparatus according to the second embodiment of the present invention.

FIG. 8 schematically shows a reactive sputtering apparatus according to the second embodiment of the present invention. This apparatus is different from the reactive sputtering apparatus in FIG. 1 in that film formation rate controlling member composed of the first shutter 21*a* and second shutters 22*a* and 22*b* are provided instead of the shutter 8 in FIG. 1, in that a plate-shaped movable shutter 23 is additionally provided as a film thickness correcting member close to the substrate holder 3, and in that a plasma source 24 is additionally provided to promote the oxidizing reaction.

Figure 9:
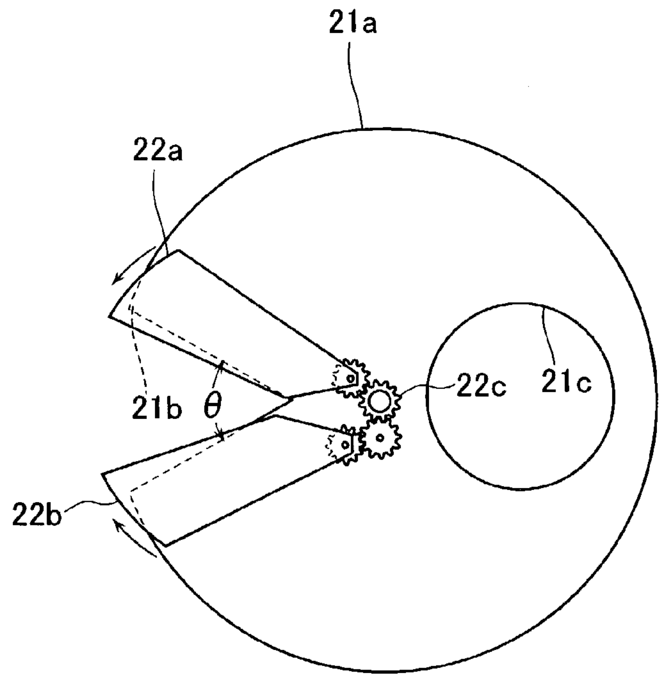
FIG. 9 is a top view of the first shutter and second shutters (film formation rate controlling member) in FIG. 8.

Among these components, the first shutter 21*a* and the second shutters 22*a* and 22*b* are shown in FIG. 9 in a top view. With reference to FIG. 9, the first shutter 21*a* has an opening 21*b* with an opening angle θ, an opening 21*c* and second shutters 22*a* and 22*b*. When a driving work (not shown) rotates a drive gear 22*c* coaxial with the rotating shaft 9, the second shutters 22*a* and 22*b* can increase or reduce the opening extent of the opening 21*b* in the shutter 21*a*.

Furthermore, a shutter 23 is movable in a parallel direction to the substrate 4. When the movable shutter 23 is inserted into the sputtering apparatus 1 by a driving work (not shown), it is located between the substrate 4 and the sputtering cathode 6 to shut off film formation on the substrate 4 by sputtering.

To form a film on the glass substrate 4 using the film forming apparatus 1 in FIG. 8, a pre-treatment and a presputtering step like the case of FIG. 1 are first carried out. Then, Ar gas is introduced through the gas introducing port 12*a* as sputtering gas, while oxygen gas is introduced through the gas introducing port 12*b* as reactive gas. Furthermore, the shutter 23 is moved to a location outside the substrate 4 and is made standing by far enough from the rotation circle thereof. Then, the first shutter 21*a* is rotated around the rotating shaft 9 while keeping a sufficient opening extent of the second shutters 22*a* and 22*b* so as to locate the opening 21*b* in the first shutter 21*a* over the target 5. Then, electric power is applied to the sputtering cathode 6 to start sputtering the Ti target 5 on the sputtering cathode 6. Thus, an oxide film consisting of $TiO_2$ is formed on the substrate 4. At that time, the substrate holder 3 and thus the substrate 4 are rotating around the rotating shaft 2.

In this embodiment, the oxide film consisting of $TiO_2$ is formed as dielectric thin film. However, a nitride film may be formed by introducing nitrogen gas through the gas introducing port 12*b* as reactive gas.

When the oxide film consisting of $TiO_2$ is formed, since the first shutter 21*a* has the opening 21*b* shaped so that the outer the rotation circle expands along the radius of the rotatable substrate 4, the higher the film formation rate becomes, the distribution of the film thickness of the thin film formed on the substrate 4 shows inclination that the outer the rotation circle expands along the radius of the rotatable substance 4, the larger the film thickness becomes.

Then, $TiO_2$ on the substrate 4 is formed continuously for a predetermined time. Subsequently, when the film thickness monitor 10 detects that the thickness of the thickest region of the film reaches to about 95% out of the desired thickness, the drive gear 22*c* of the first shutter 21*a* reduces the opening extent of the second shutters 22*a* and 22*b*. This reduces the opening 21*b* in the first shutter 21*a*. At that time, the opening extent of the shutters 22*a* and 22*b* and thus of the opening 21*b* in the first shutter 21*a* are reduced in order to make the film formation rate less than that of the initial state by reducing each opening area. With respect to realization of strictly precise uniformity desired for the thickness of the thin film, the flatness of circumferential distribution of the film thickness depends significantly on whether or not a film is being formed at the moment when the shutter is opened to start or closed to end film formation, while this dependency can be lowered by reducing the film formation rate on the way of the film formation as described above. As a result, the flat distribution of the film thickness can be obtained in the circumferential direction. In this sense, the first shutter 21*a* having the second shutters 22*a* and 22*b*, namely opening and closing shutters has the function as film formation rate controlling members by enabling the opening area of the opening 21*b* to be changed. Furthermore, this reduction in film formation rate does not affect sputtering conditions per se, because the state of surface of the target 5, the partial pressure of the reactive gas and the like are not fluctuated unlike the case of a reduction in film formation rate by decreasing electric power applied to the sputtering cathode 6.

On the other hand, the film thickness monitor 10 uses the first monitor $\mathbf{10}a_1$–$\mathbf{10}b_1$, the second monitor $\mathbf{10}a_2$–$\mathbf{10}b_2$ and the third monitor $\mathbf{10}a_3$–$\mathbf{10}b_3$ to measure the thickness of the thin film on the substrate 4 at three measured points $\mathbf{10}_1$, $\mathbf{10}_2$ and $\mathbf{10}_3$ each by each. Obtaining these three-point data at every predetermined time enables monitoring of the distribution of the thickness of the thin film in the radial direction of rotation circle of the substrate holder 3. In FIG. 8, reference numerals $\mathbf{10}_1'$, $\mathbf{10}_2'$ and $\mathbf{10}_3'$ denote the points, located in the film formation region of the substrate 4, on each concentric circle corresponding to the positions $\mathbf{10}_1$, $\mathbf{10}_2$ and $\mathbf{10}_3$, each belonging to the film thickness monitor 10.

Then, $TiO_2$ on the substrate 4 is formed continuously for a predetermined time while keeping the opening extent of the second shutters 22*a* and 22*b* smaller. Once the film thickness monitor 10 detects that the film thickness reaches to the desired value by the first monitor $\mathbf{10}a_1$–$\mathbf{10}b_1$, the shutter 23 is moved so that an end portion 23*a* of the shutter 23 sufficiently covers predetermined region between the positions $\mathbf{10}_1'$ and $\mathbf{10}_2'$ of the concentric circles, the positions $\mathbf{10}_1'$ and $\mathbf{10}_2'$ being corresponding to the measured positions $\mathbf{10}_1$ and $\mathbf{10}_2$. Thus, the film formation at the region close to the measuring position $\mathbf{10}_1$ is shut off and finished accordingly.

Then, $TiO_2$ on the substrate 4 is formed continuously for a predetermined time in the above-mentioned state. Once the film thickness monitor 10 detects that the film thickness reaches to the desired value by the second monitor $\mathbf{10}a_2$–$\mathbf{10}b_2$, the shutter 23 is moved so that the end portion 23*a* of the shutter 23 sufficiently covers predetermined region between the positions $\mathbf{10}_2'$ and $\mathbf{10}_3'$ of the concentric circles, the positions $\mathbf{10}_2'$ and $\mathbf{10}_3'$ being corresponding to the measured positions $\mathbf{10}_2$ and $\mathbf{10}_3$. Thus, the film formation at the region close to the measuring position $\mathbf{10}_2$ is shut off and finished accordingly.

Then, $TiO_2$ on the substrate 4 is formed continuously for a predetermined time in the above-mentioned state. Once the film thickness monitor 10 detects that the film thickness reaches to the desired value by the third monitor $\mathbf{10}a_3$–$\mathbf{10}b_3$, the shutter 23 is moved to allow the end portion 23*a* to reach a central position 4*a* of the substrate 4 so that half of the substrate 4 is entirely covered with the movable shutter 23. Thus, the film formation on the substrate 4 is shut off and simultaneously all the film formation process is finished.

In this embodiment, the distribution of the film thickness of the thin film shows inclination that the outer the rotation circle expands along the radius of the rotatable substrate 4, the larger the film thickness becomes, by using the first shutter 21*a* having the opening 21*b* shaped so that the outer the rotation circle expands along the radius of the rotatable substrate 4, the higher the film formation rate becomes. The distribution of the film thickness inclined in the radial direction is flattened so as to sequentially obtain thin film with the uniform desired film thickness, by moving the shutter 23 from outside to inside of the rotation circle to sequentially shut off film formation from outside to inside of the rotation circle.

However, the present invention is not restricted to such an embodiment. For example, conversely, it is possible to obtain a flat distribution of film thickness by having in advance formed a distribution of film thickness inclined so that the inner the rotation circle expands along the radius of the rotatable substrate 4, the larger the film thickness becomes and then sequentially shutting off film formation from inside to outside of the rotation circle.

Furthermore, the distribution of the film thickness can be more precisely controlled using a larger number of measurement positions of the film thickness monitor 10. Furthermore, the distribution of the film thickness can be more precisely controlled by continuously moving the shutter 23 than by moving it step by step instead.

EXAMPLES

Example 1

The sputtering apparatus in FIG. 3 was used to place an optically polished doughnut-shaped glass substrate having a diameter 200 mm on the substrate holder 3. Then, the inside of the chamber 1 was evacuated to pressure of $1\times10^{-5}$ Pa or less. Then, 20 sccm of Ar gas was introduced through the gas introducing port 11, while 5 sccm of oxygen gas was introduced through the gas introducing port 12*b*. Thus, the inside of the chamber 1 was maintained at pressure of 0.5 Pa. The first and second film thickness correcting plates 13 and 14 were kept so as not to locate over the substrate. After confirming that none of the openings 8*a*, 8*b* and 8*c* in the shutter 8 were located over the sputtering cathode 6, the substrate holder 3 was rotated around the rotating shaft 2 at 1,500 rpm. Then, pulse DC electric power of 2-kW, which had been ready to prevent anomalous discharge, was applied to the sputtering cathode 6 to start discharging. The target material was Ti. The opening 8*a* in the shutter 8 was located over the sputtering cathode 6, and film formation was started. At that time, $TiO_2$ was formed at rate of 200 Å/min. The shutter 8 was closed when the film thickness monitor 10 already adjusted indicated a film thickness of 1,990 Å (the maximum of the values obtained at the measured points).

Then, corresponding to the results of the measurements carried out by the film thickness monitor, the first film thickness correcting plate 13 having the opening shape 13*a*, was moved to between the sputtering cathode 6 and the surface of the substrate 4. Then, the opening 8*b* in the shutter 8 was moved to over the sputtering cathode 6. At that time, film was formed at rate of 20 Å/min. The shutter 8 was closed when the film thickness monitor 10 indicated a film thickness of 2,000 Å (the maximum of the values obtained at the measured points) in total.

After the film had been formed, the substrate 4 was taken out. An ellipsometer was used to measure the thickness of the thin film and the distribution of the film thickness on the substrate 4. As a result, the average film thickness was 2,000.3 Å and the distribution of the film thickness had a dispersion of ±0.08% against the average film thickness. Furthermore, the same experiments were repeated five times to measure reproducibility. As a result, the average film thickness and the dispersion were indicated as 2,000.0 Å±0.08%, 2,000.5 Å±0.05%, 1,998.8 Å±0.08%, 2,000.1 Å±0.06% and 1,999.6 Å±0.07%.

Example 2

The sputtering apparatus in FIG. 3 was used to start film formation under the same conditions as in Example 1. $TiO_2$ was formed at rate of 200 Å/min. Then, the shutter 8 was closed at first when the film thickness monitor 10 indicated a film thickness of 1,990 Å. The film thickness monitor was carried out upon one-point measurements, and measured the film thickness at plural points on the substrate 4 while moving in the radial direction of the substrate 4.

Then, the film formation was carried out at rate of 20 Å/min using the first film thickness correcting plate 13 having the opening 13*a* and the opening 8*b* in the shutter 8. The shutter 8 was closed again when the film thickness monitor 10 indicated a film thickness of 1,996 Å in total.

Next, the shutter 8 was closed again using the second film thickness correcting plate 14 having the opening 14*a* and the opening 8*c* in the shutter 8 when the film thickness monitor 10 indicated a thickness of 2,000 Å in total at film formation rate of 5 Å/min.

After the film had been formed, the substrate 4 was taken out. The ellipsometer was used to measure the thickness of the thin film and the distribution of the film thickness on the substrate 4. As a result, the average film thickness was 2,000.0 Å and the distribution of the film thickness had a dispersion of ±0.02% against the average film thickness.

Example 3

The third film thickness correcting plate 16, shown in FIG. 7 in a top view, was used instead of the first and second film thickness correcting plates 13 and 14 of the sputtering apparatus in FIG. 3. The third film thickness correcting plate 16 has such a structure that shutter splines $\mathbf{18}_1$ to $\mathbf{18}_{14}$ were connected to microcylinders $\mathbf{17}_1$ to $\mathbf{17}_{14}$ each by each, that each of the microcylinders $\mathbf{17}_1$ to $\mathbf{17}_{14}$ might be stretchable using a signal cable 20 extending through the rotating shaft 19, and that the shape of the opening 16*a* might be arbitrarily variable by moving the splines $\mathbf{18}_1$ to $\mathbf{18}_{14}$.

A film was formed by appropriately changing the shape of the opening 16*a* in the third film thickness correcting plate 16 under substantially the same conditions as in Example 2 except that the third film thickness correcting plate 16 was used instead of the first and second film thickness correcting plates 13 and 14. As a result, that the average film thickness was 2,000.0 Å and the distribution of the film thickness had a dispersion of ±0.03% against the average film thickness.

Comparative Example 1

The sputtering apparatus in FIG. 1 was used to place an optically polished doughnut-shaped glass substrate having a diameter 200 mm on the substrate holder 3. Then, the inside of the chamber was evacuated to pressure of $1\times10^{-5}$ Pa or less. Then, 20 sccm of Ar gas was introduced through the gas introducing port 11, while 5 sccm of oxygen gas was introduced through the gas introducing port 12*b*. Thus, the inside of the chamber 1 was maintained at pressure of 0.5 Pa. After confirming that the opening 8*a* in the shutter 8 was not located over the sputtering cathode 6, the substrate holder 3 was rotated around the rotating shaft 2 at 1,500 rpm. Then, pulse DC electric power of 2-kW, which had been ready to prevent anomalous discharge, was applied to the sputtering cathode 6 to start discharging. The target material was Ti. The opening 8*a* in the shutter 8 was located over the sputtering cathode 6, and film formation was started. At that time, $TiO_2$ was formed at rate of 200 Å/min. The shutter 8 was closed when the film thickness monitor 10 already adjusted indicated a film thickness of 2,000 Å.

After the film had been formed, the substrate 4 was taken out. The ellipsometer was used to measure the thickness of the thin film and the distribution of the film thickness on the substrate 4. As a result, the average film thickness was 2,004.6 Å and the distribution of the film thickness had a dispersion of ±3.2% against the average film thickness.

Comparative Examples 2 to 6

Completely the same experiments as in Comparative Example 1 were repeated five times. As a result, the average film thickness and the dispersion were indicated as 1,998.7 Å±0.6%, 1,997.7 Å±4.5%, 2,001.0 Å±2.1%, 1,998.0 Å±1.4% and 2,003.3 Å±1.8%.

Example 4

The sputtering apparatus in FIG. 8 was used to place an optically polished doughnut-shaped glass substrate having a diameter 200 mm on the substrate holder 3. Then, the inside of the chamber was evacuated to pressure of $1\times10^{-5}$ Pa or less. Then, 20 sccm of Ar gas was introduced through the gas introducing port 11, while 5 sccm of oxygen gas was introduced through the gas introducing port 12*b*. Thus, the inside of the chamber 1 was maintained at pressure of 0.5 Pa. The shutter 23 was kept so as not to locate over the substrate 4. After confirming that the openings 21*b* and 21*c* in the first shutter 21*a* were not located over the sputtering cathode 6, the substrate holder 3 was rotated around the rotating shaft 2 at 1,500 rpm. Then, pulse DC electric power of 2-kW, which had been ready to prevent anomalous discharge, was applied to the sputtering cathode 6 to start discharging. The target material was Ti.

Then, the opening 21*a* in the first shutter 21*a* was located over the sputtering cathode 6, and discharging was started. Furthermore, to promote the oxidizing reaction of Ti, 600-W electric power was introduced into the plasma source 24 to emit plasma. The plasma was allowed to reach close to the substrate 4 through the opening 21*c* in the first shutter 21*a*. At that time, $TiO_2$ was formed at rate of 150 Å/min. When the optical film thickness monitor 10 already adjusted detected that the film thickness reached to 1,990 Å at an outermost measured point $\mathbf{10}_1$, a driving work (not shown) moved the drive gear 22*c* to reduce the opening extent of the second shutters 22*a* and 22*b*, which controlled the film formation rate. When the angle of this opening reached to about one-tenth of the opening angle θ of the opening 21*b* in the first shutter 21*a*, the operation of reducing the opening extent of the second shutters 22*a* and 22*b* was suspended.

Right before the suspension, the thickness of the thin film on the substrate 4 had such a tendency that the outer the rotation circle expands along the radius of the substrate 4, the larger the thickness becomes. At that time, the first monitor $\mathbf{10}a_1$–$\mathbf{10}b_1$, the second monitor $\mathbf{10}a_2$–$\mathbf{10}b_2$ and the third monitor $\mathbf{10}a_3$–$\mathbf{10}b_3$ indicated the film thickness values of 1,990 Å, 1,980 Å, and 1,965 Å, each by each. The film formation rate was 15 Å/min when the second shutters 22*a* and 22*b* were moved to reduce the opening area in the first shutter 21*a*.

The thin film was formed continuously in the above-mentioned state. When the first monitor $\mathbf{10}a_1$–$\mathbf{10}b_1$ indicated the film thickness of 2,000 Å, the shutter 23 was moved so that the end portion 23*a* thereof sufficiently covers the film formation position $\mathbf{10}_1'$ on the substrate 4, corresponding to the measured position $\mathbf{10}_1$ for the first monitor $\mathbf{10}a_1$–$\mathbf{10}b_1$. Thus, the film formation was shut off from being formed in the region between the outer edge of the rotatable substrate 4 and the close range of the film formation position $\mathbf{10}_1'$. As a result, in this region, the film thickness became 2,000 Å and film formation was finished. At that time, the second monitor $\mathbf{10}a_2$–$\mathbf{10}b_2$ and the third monitor $\mathbf{10}a_3$–$\mathbf{10}b_3$ indicated the film thickness values of 1,988 Å and 1,971 Å, each by each.

The thin film was formed continuously in the above-mentioned state. When the second monitor $\mathbf{10}a_2$–$\mathbf{10}b_2$ indicated the film thickness of 2,000 Å, the shutter 23 was moved so that the end portion 23*a* thereof sufficiently covers the film formation position $\mathbf{10}_2'$ on the substrate 4, corresponding to the measured position $\mathbf{10}_2$ for the first monitor $\mathbf{10}a_2$–$\mathbf{10}b_2$. Thus, the film formation was shut off from being formed in the area between the outer edge of the rotatable substrate 4 and the close range of the film formation position $\mathbf{10}_2'$. As a result, in this region, the film thickness became 2,000 521 and film formation was finished. At that time, the third monitor $\mathbf{10}a_3$–$\mathbf{10}b_3$ indicated a film thickness value of 1,980 Å.

The thin film was formed continuously in the above-mentioned state. When the third monitor $\mathbf{10}a_3$–$\mathbf{10}b_3$ indicated the film thickness of 2,000 Å, the shutter 23 was moved to allow the end portion 23*a* thereof to reach the central position 4*a* of the substrate 4 so that half of the substrate 4 might be entirely covered with the movable shutter 23. Then, film formation on the substrate 4 was shut off. As a result, uniform film thickness of 2,000 Å was sequentially obtained on the substrate 4 and film formation was finished accordingly.

After the film had been formed, the substrate 4 was taken out. The ellipsometer was used to measure the thickness of the thin film and the distribution of the film thickness on the substrate 4. As a result, the average film thickness was 2,000.0 Å and the distribution of the film thickness had a dispersion of ±0.01% against the average film thickness. The value of the dispersion is excellent.

Comparative Example 7

Figure 10:
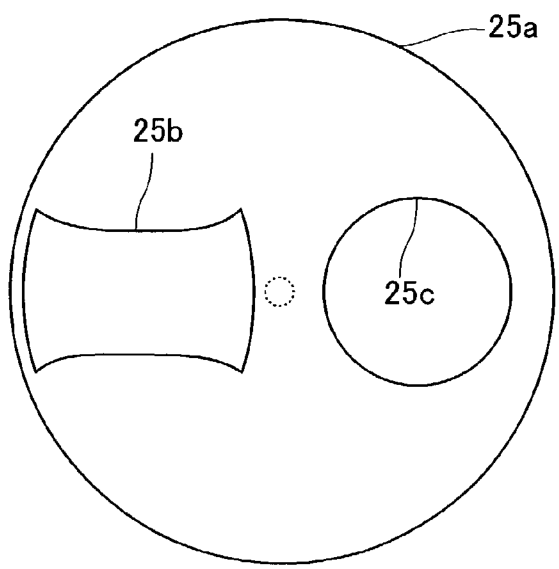
FIG. 10 is a top view of a shutter plate (film formation rate controlling member) used in Comparative Example 7.

A shutter plate 25*a* was used instead of the first shutter 21*a* and second shutters 22*a* and 22*b*, which control the film formation rate. With reference to FIG. 10, the shutter plate 25*a* had an opening 25*b* generally used in conventional apparatuses and an opening 25*c* having the same shape as the opening 21*c* in FIG. 9. The opening 25*c* allows plasma to reach to the close range of the substrate 4 under substantially the same conditions as in Example 4. A thin film was formed using the sputtering apparatus 1, shown in FIG. 8, under substantially the same conditions as in Example 4 except that the shutter plate 25*a* was used. Measurements of the substrate 4 obtained were carried out. As a result, the distribution of the film thickness obtained was such that at the film formation positions in the circumferential direction located 40 mm remote from the central position 4*a* of the substrate 4, the average film thickness and dispersion were indicated as 2,007.2 Å±1.3%. Furthermore, the distribution of the film thickness obtained was such that at the film formation positions in the circumferential direction located 80 mm remote from the central position 4*a* of the substrate 4, the average film thickness and dispersion were indicated as 2,006.9 Å±1.0%. The whole substrate had a distribution that the average film thickness and dispersion were indicated as 2,007.1 Å±1.8%.

As is apparent from the above-mentioned description, a thin film is formed to a dominant percentage out of desired thickness using a conventional film forming method and the film forming apparatus according to the first embodiment of the present invention. Then, corresponding to the results of the measurements of the thickness of the thin film formed on the substrate and the distribution of the film thickness, the most appropriate film thickness correcting plate is selected to adjust the opening area in the shutter to reduce the film formation rate and then at the reduced rate the remaining portion of the film thickness is formed. Consequently, a thin film can be formed which has a distribution of film thickness which is well precisely uniform in the radial and circumferential directions of the rotatable substrate.

Furthermore, a thin film having more precisely uniform distribution of the film thickness can be efficiently formed by repeating corrections of the film thickness at lower film formation rate corresponding to the results of the above-mentioned measurements.

Furthermore, a thin film is formed to a dominant percentage out of desired thickness using the conventional film forming method and the film forming apparatus according to the second embodiment of the present invention. Then, corresponding to the results of the measurements of the thickness of the thin film formed on the substrate and the distribution of the film thickness, the opening and closing shutter can be moved to adjust the opening extent of the opening in the film formation rate controlling member to reduce the film formation rate and then at the reduced rate the remaining portion of the film thickness is formed. Furthermore, corresponding to the thickness of the thin film formed on the substrate and the distribution of the film thickness, the shutter can be moved to shut off the film formation in a film formation region of the substrate, which has obtained the desired film thickness. That is, as soon as the desired film thickness is obtained in a certain region of the substrate, the film formation in that region is finished. Therefore, once the film formation is finished in all the film formation regions of the substrate, a thin film can be formed so that the distribution of film thickness shows precisely uniform in the radial and circumferential directions of the rotatable substrate.

What is claimed is:

1. A thin film forming apparatus, comprising a substrate and a film forming source which are mutually located opposite, the apparatus further comprising a film formation rate controlling member having a plurality of openings, at least one of the plurality of openings having a changeable angle, so as to control a film formation rate of a thin film formed on said substrate, and a film thickness correcting member used to correct the thickness of the thin film formed on said substrate, said film formation rate controlling member and said film thickness correcting member being provided so as to be inserted between said substrate and said film forming source and to be removed therefrom.

2. The thin film forming apparatus according to claim 1, wherein, when said film formation rate controlling member and said film thickness correcting member are inserted between said substrate and said film forming source, these components are disposed in the order of said substrate, said film thickness correcting member, said film formation rate controlling member and said film forming source.

3. A thin film forming apparatus, comprising a substrate and a film forming source which are mutually located opposite, the apparatus further comprising a film formation rate controlling member having an opening to control a film formation rate of a thin film formed on said substrate, and a film thickness correcting member having an opening used to correct the thickness of the thin film formed on said substrate, said film formation rate controlling member and said film thickness correcting member being provided so as to be inserted between said substrate and said film forming source and to be removed therefrom, and wherein said film formation rate controlling member has two or more openings which are different each in area and each of the openings can be selected in the order of the scale of the area of the opening.

4. A thin film forming apparatus, comprising a substrate and a film forming source which are mutually located opposite, the apparatus further comprising a film formation rate controlling member having an opening to control a film formation rate of a thin film formed on said substrate, and a film thickness correcting member having an opening used to correct the thickness of the thin film formed on said substrate, said film formation rate controlling member and said film thickness correcting member being provided so as to be inserted between said substrate and said film forming source and to be removed therefrom, and wherein said film formation rate controlling member is two or more film formation rate controlling plates each having an opening, the openings in the film formation rate controlling plates being different each in area, and each of the film formation rate controlling plates can be selected.

5. A thin film forming apparatus, comprising a substrate and a film forming source which are mutually located opposite, the apparatus further comprising a film formation rate controlling member having an opening to control a film formation rate of a thin film formed on said substrate, and a film thickness correcting member having an opening used to correct the thickness of the thin film formed on said substrate, said film formation rate controlling member and said film thickness correcting member being provided so as to be inserted between said substrate and said film forming source and to be removed therefrom, and wherein said film thickness correcting member has two or more openings each having a different shape and each of the openings can be selected depending on the distribution of the thickness of the thin film on the substrate.

6. The thin film forming apparatus according to claim 3, wherein the opening in said film thickness correcting member has two or more selectable shutters movable and the area of said opening can be increased or reduced by selectively moving said shutter depending on the distribution of the thickness of the thin film on the substrate.

7. A method for forming a thin film using the film forming apparatus according to claim 3, said method comprising the first step of first forming said thin film to a predetermined percentage out of thickness, the second step of then measuring the distribution of the thickness of the thin film formed in the first step, and the third step of further inserting said film formation rate controlling plate between said substrate and said film forming source to make a film formation rate less than that of said first step, and inserting said film thickness correcting member plate corresponding to the distribution of the film thickness measured in said second step to correct the thickness of the thin film.

8. The method for forming a thin film according to claim 7, wherein the second step is repeated to measure the distribution of the thickness of the thin film formed in repeated third step, and the current third step and the repeated second step are subsequently repeated in a cycle until said thin film is measured to have a desired thickness as a result of the repeated second step, the repeated third step of inserting, between said substrate and said film forming source, the film formation rate controlling plate having an opening, which enables the film formation rate to be controlled, in order to thus make the film formation rate less than that of a preceding third step, and inserting, between said substrate and said film forming source, the film thickness correcting member plate having an opening which enables the thickness of the thin film to be corrected corresponding to the distribution of the film thickness measured in preceding second step carried out again after said preceding third step, each second step measuring the distribution of the thickness of the thin film formed in each third step.

9. The method for forming a thin film according to claim 7 or 8, wherein during a same cycle, said second step is carried out simultaneously together with said first step and said third step.

10. The thin film forming apparatus according to claim 3, wherein said substrate comprises a rotatable substrate, film thickness measuring means is provided to measure the thickness of said thin film at plural measured points along the radius of the rotatable substrate, said film formation rate controlling member is provided with an opening which serves to a film formation rate gradient inclined along the radius of said rotatable substrate and an opening and closing shutter which enables the opening extent of the opening to be increased or reduced, and a movable shutter is used as said film thickness correcting member to shut off formation of a thin film on said substrate.

11. A method for forming a thin film using the thin film forming apparatus according to claim 10, said method comprising the first step of first inserting, among said film formation rate controlling member and said film thickness correcting member, only said film formation rate controlling member between said substrate and said film forming source and forming said thin film to a predetermined percentage out of thickness, while the opening and closing shutter of said film formation rate controlling member remains open, the second step of then moving the opening and closing shutter of said film formation rate controlling member corresponding to a value measured by said film thickness measuring means during said first step while only said film formation rate controlling member remains inserted between said substrate and said film forming source during the first step, thereby reducing the opening extent of said opening as compared to that of said first step, and the third step of subsequently moving said shutter between said substrate and said film forming source corresponding to the value measured by said film thickness measuring means during said second step while the opening extent of the opening in said film formation rate controlling member reduced during the second step remains reduced, thereby shutting off film formation in a film formation region on said substrate in which the desired film thickness has been achieved.

12. The thin film forming apparatus according to claim 3, wherein said film forming source is provided as a sputtering cathode.

13. The thin film forming apparatus according to claim 12, wherein a dielectric thin film is formed by a reaction of a target material with reactive gas by reactive sputtering process which uses said sputtering cathode, sputtering gas comprising of rare gas and reactive gas.

14. The thin film forming apparatus according to claim 13, which comprises metal film forming means using said sputtering gas comprising of rare gas to sputter target metal of said sputtering cathode to form a metal thin film on said substrate and oxidizing or nitriding means for oxidizing or nitriding the metal thin film formed on said substrate using said reactive gas, thereby forming a dielectric thin film.

15. The thin film forming apparatus according to claim 10, wherein said film forming source is provided as a sputtering cathode.

16. The thin film forming apparatus according to claim 15, wherein a dielectric thin film is formed by a reaction of a target material with reactive gas by reactive sputtering process which uses said sputtering cathode, sputtering gas comprising of rare gas and reactive gas.

17. The thin film forming apparatus according to claim 16, which comprises metal film forming means using said sputtering gas comprising of rare gas to sputter target metal of said sputtering cathode to form a metal thin film on said substrate and oxidizing or nitriding means for oxidizing or nitriding the metal thin film formed on said substrate using said reactive gas, thereby forming a dielectric thin film.

18. The method for forming a thin film according to claim 7, wherein the step of inserting said film thickness correcting member plate comprises correcting a radial distribution thickness of the thin film and a circumferential distribution thickness of the thin film.

* * * * *